United States Patent
Ning

(10) Patent No.: US 11,862,290 B2
(45) Date of Patent: Jan. 2, 2024

(54) MEMORY CHIP AND MEMORY SYSTEM

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 20 days.

(21) Appl. No.: 17/661,553

(22) Filed: Apr. 30, 2022

(65) Prior Publication Data

US 2023/0178124 A1 Jun. 8, 2023

(30) Foreign Application Priority Data

Dec. 8, 2021 (CN) .......................... 202111491022.9

(51) Int. Cl.
| | |
|---|---|
| *G11C 7/14* | (2006.01) |
| *G11C 7/10* | (2006.01) |
| *G01R 31/3185* | (2006.01) |
| *G11C 17/12* | (2006.01) |
| *G11C 7/22* | (2006.01) |

(52) U.S. Cl.
CPC ........ *G11C 7/14* (2013.01); *G01R 31/318536* (2013.01); *G11C 7/1051* (2013.01); *G11C 7/1066* (2013.01); *G11C 7/1096* (2013.01); *G11C 7/22* (2013.01); *G11C 17/12* (2013.01)

(58) Field of Classification Search
CPC ....... G11C 7/14; G11C 7/1066; G11C 7/1096; G11C 17/12; G11C 5/148; G11C 7/22; G11C 11/4076; G11C 16/26; G11C 16/32; G11C 29/32; G11C 11/4091; G11C 5/147; G01R 31/318536; Y02D 10/00
See application file for complete search history.

(56) References Cited

U.S. PATENT DOCUMENTS

| | | | |
|---|---|---|---|
| 7,362,129 B1 * | 4/2008 | Rahman | H03K 19/00384 326/26 |
| 2007/0120583 A1 * | 5/2007 | Lam | H03L 7/0802 327/156 |

FOREIGN PATENT DOCUMENTS

CN 112947669 A 6/2021

* cited by examiner

*Primary Examiner* — Jay W. Radke
(74) *Attorney, Agent, or Firm* — Syncoda LLC; Feng Ma

(57) ABSTRACT

A memory chip stores a characterization parameter for characterizing a process corner of the memory chip, the memory chip further has a reference voltage with an adjustable value, the value of the reference voltage is adjustable based on the characterization parameter, and the memory chip adjusts, based on the reference voltage, a delay from reading out data from a memory cell to outputting the data through a data port.

19 Claims, 9 Drawing Sheets

MEMORY CHIP AND MEMORY SYSTEM

CROSS-REFERENCE TO RELATED APPLICATION

This application claims priority to Chinese Patent Application No. 202111491022.9 filed on Dec. 8, 2021, the disclosure of which is hereby incorporated by reference in its entirety.

BACKGROUND

Semiconductor memories may be classified into non-volatile memories and volatile memories. A dynamic random-access memory (DRAM), as a volatile memory, has advantages of a high storage density and a fast read and write speed, and is widely used in various electronic systems.

A DRAM system usually includes a controller and a plurality of memory chips. Performance of different memory chips varies with manufacturing processes and other differences. This affects the overall performance of the DRAM system.

SUMMARY

Embodiments of the present disclosure relate to the technical field of semiconductors, and in particular, to a memory chip and a memory system.

Embodiments of the present disclosure provide a memory chip and a memory system.

According to some embodiments, an aspect of the embodiments of the present disclosure provides a memory chip, applied to included in a memory system. The memory chip is configured such that the memory chip stores a characterization parameter for characterizing a process corner of the memory chip, the memory chip further has a reference voltage with an adjustable value, the value of the reference voltage is adjustable based on the characterization parameter, and the memory chip adjusts, based on the reference voltage, a delay from reading out data from a memory cell to outputting the data through a data port.

According to some embodiments, another aspect of the embodiments of the present disclosure further provides a memory system, including a plurality of the memory chips each provided in any one of the foregoing embodiments; and a controller, where the controller is configured to: obtain characterization parameters of the plurality of memory chips, and adjust, based on the characterization parameters, the values of the reference voltages of the memory chips corresponding to the characterization parameters.

BRIEF DESCRIPTION OF THE DRAWINGS

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

DETAILED DESCRIPTION

Figure 1:
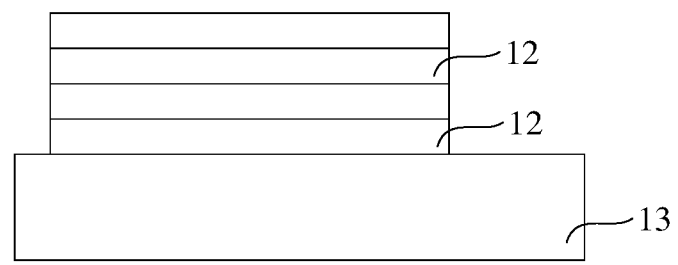
FIG. 1 is a schematic structural diagram of a memory system.
Figure 2:
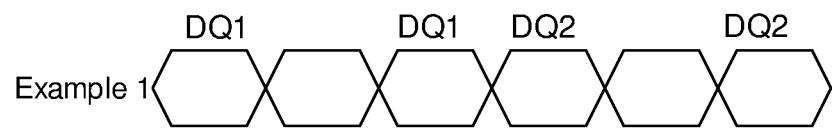
FIG. 2 is a schematic diagram of data transmission in the memory system according to FIG. 1.
Figure 2:
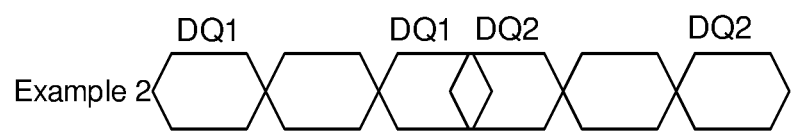

FIG. 1 is a schematic structural diagram of a memory system. FIG. 2 is a schematic diagram of data transmission in the memory system according to FIG. 1. Referring to FIG. 1, the memory system may include: a controller 13; and a plurality of memory chips 12 that are located on a surface of the controller 13 and that are provided in a stacked manner, where the memory chip 12 may be a DRAM chip.

Because different memory chips 12 vary in process, electrical properties exhibited by the different memory chips 12 are also different, for example, threshold voltages or on-currents of transistors in the different memory chips 12 are different, resulting in different delays of data transmission inside the different memory chips 12. This causes data signals received by the controller 13 from the different memory chips 12 to be skewed, levels of different data signals to be inconsistent, the data signals of the different memory chips 12 to have a conflict, and so on, affecting overall performance of the memory system. Specifically, referring to FIG. 2, an example 1 in FIG. 2 is a schematic diagram of ideal transmission of data signals corresponding to two memory chips 12, where DQ1 and DQ2 are respectively the data signals that correspond to the different memory chips 12 and that are transmitted to the controller 13; and an example 2 in FIG. 2 is an example diagram of actual transmission of the data signals corresponding to the two memory chips 12, where DQ1 corresponds to a memory chip 12 with a slow process corner, and DQ2 corresponds to a memory chip 12 with a fast process corner. In an actual transmission process, data of DQ2 starts to be transmitted before transmission of data of DQ1 is finished. This leads to a data conflict between DQ1 and DQ2, causing storage performance of the memory system to deteriorate.

Based on this, an embodiment of the present disclosure provides a memory chip. The memory chip is included in a memory system, and a reference voltage in the memory chip for controlling a data transmission delay is adjustable based on a characterization parameter for characterizing a process corner to resolve a data conflict problem of the memory system, and improve uniformity of alignment of data signals, thereby improving read and write performance of the memory system.

To make the objectives, technical solutions, and advantages of the embodiments of the present disclosure clearer, the embodiments of the present disclosure are described below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 3:
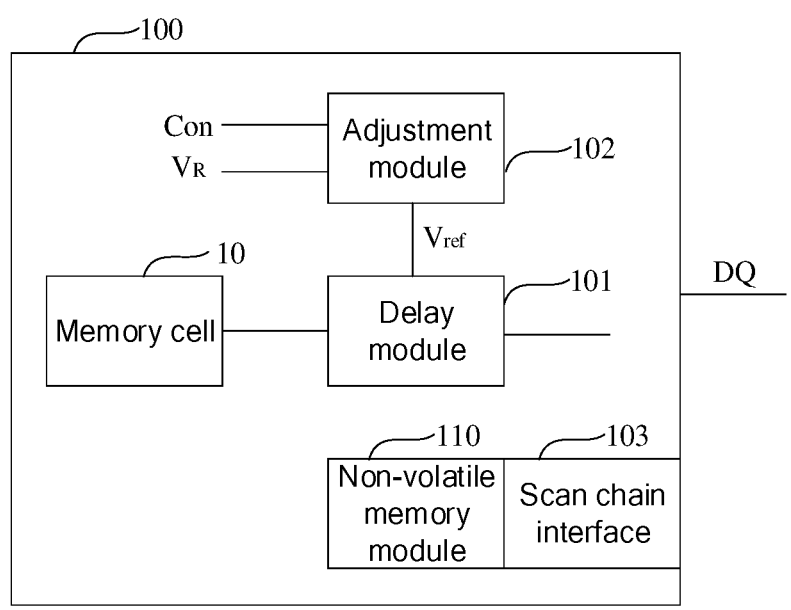
FIG. 3 is a schematic structural diagram of a memory chip according to an embodiment of the present disclosure.

FIG. 3 is a schematic structural diagram of a memory chip according to an embodiment of the present disclosure.

Referring to FIG. 3, a memory chip 100 provided in an embodiment of the present disclosure is included in a memory system, and the memory chip 100 is configured such that the memory chip 100 stores a characterization parameter for characterizing a process corner of the memory chip 100, the memory chip 100 further has a reference voltage Vref with an adjustable value, the value of the reference voltage Vref is adjustable based on the characterization parameter, and the memory chip 100 adjusts, based on the reference voltage Vref, a delay from reading out data from a memory cell 10 to outputting the data through a data port DQ.

The reference voltage $V_{ref}$ is related to the delay from reading out the data from the memory cell 10 to outputting the data through the data port DQ. Specifically, for a same memory chip 100 or a same memory chip 100 with a same process corner, a higher reference voltage $V_{ref}$ indicates a smaller delay from reading out the data from the memory cell 10 to outputting the data through the data port DQ. That is, different memory chips 100 have a problem of different delays of the chips caused by different process corners, a memory chip 100 with a slow process corner has a larger delay, and a memory chip 100 with a fast process corner has a smaller delay. In this embodiment of the present disclosure, since the reference voltage $V_{ref}$ is adjustable based on the characterization parameter, the delay can be compensated based on the process corner of the memory chip 100, such that consistency of delays of the memory chips 100 is improved. Specifically, if the characterization parameter characterizes that a process corner of the memory chip 100 is a slow process corner, the reference voltage $V_{ref}$ of the memory chip 100 is increased to shorten a data delay of the memory chip 100 with the slow process corner; if the characterization parameter characterizes that a process corner of the memory chip 100 is a fast process corner, the reference voltage $V_{ref}$ of the memory chip 100 is lowered to prolong a data delay of the memory chip 100 with the fast process corner. In this way, reference voltages of different memory chips 100 are compensated accordingly based on process corners, such that actual delays of the memory chips 100 tend to be consistent or completely consistent. In this way, data transmission delays of the different memory chips 100 meet an expectation, thereby improving uniformity of data signals, preventing a problem of a data transmission conflict between the different memory chips 100 from occurring, and improving read and write performance of the memory system.

The memory chip 100 provided in the embodiments of the present disclosure is described in more detail below with reference to the accompanying drawings.

In some embodiments, the memory chip 100 may be a DRAM memory chip, such as a double data rate (DDR) 4 DRAM memory chip or a DDR5 DRAM memory chip. In other embodiments, the memory chip 100 may alternatively be a static random-access memory (SRAM) memory chip, a NAND memory chip, a NOR memory chip, a FeRAM memory chip, or a PcRAM memory chip.

The design of the memory chip 100 needs to meet conditions such as a process corner, a voltage, and a temperature, and a combination formed by the process corner, the voltage, and the temperature is referred to as a process, voltage, and temperature (PVT) condition.

In some embodiments, if a 5-process corner model is adopted, process corners of different memory chips 100 can be classified into a typical NMOS and typical PMOS (TT) process corner, a fast NMOS and fast PMOS (FF) process corner, a slow NMOS and slow PMOS (SS) process corner, a fast NMOS and slow PMOS (FS) process corner, and a slow NMOS and fast PMOS (SF) process corner. Typical means that a drive current is of an average value. Fast means that a drive current is of a maximum value. Slow means that a drive current is of a minimum value (this drive current is an Ids current). This is explained from a measurement point of view. Typical, Fast and Slow are also understood as a speed of carrier mobility, and the carrier mobility refers to an average drift speed of carriers under an action of a unit electric field.

The characterization parameter may be a binary value. In some embodiments, there are three types of process corners. In this case, the characterization parameter and the process corner may have a corresponding relationship as shown in Table 1:

TABLE 1

| Process corner | Characterization parameter |
| --- | --- |
| SS | 01 |
| TT | 00 |
| FF | 10 |

In other embodiments, there are five types of process corners. In this case, the characterization parameter and the process corner may have a corresponding relationship as shown in Table 2:

TABLE 2

| Process corner | Characterization parameter |
| --- | --- |
| SS | 000 |
| TT | 001 |
| SF | 010 |
| FS | 011 |
| FF | 100 |

Referring to FIG. 3, the memory chip 100 may include a non-volatile memory module 110, and the non-volatile memory module is used to store the characterization parameter. The non-volatile memory module 110 is used to store the characterization parameter, such that even if the memory chip 100 is powered on or off, a capability of storing the characterization parameter by the memory chip 100 remains unchanged.

In some embodiments, the non-volatile memory module 110 may include a one-time programmable (OTP) memory cell. In other embodiments, the non-volatile memory module 110 may alternatively be a programmable read-only memory (PROM) cell or an electrically erasable programmable read-only memory (EEPROM).

It can be understood that, after the memory chip 100 is designed and manufactured, the process corner of the memory chip 100 may be detected, and the characterization parameter of the process corner obtained through the detection may be stored in the non-volatile memory module 110 of the memory chip 100. Specifically, before a memory wafer is cut to obtain discrete memory chips 100, process corners may be detected and characterization parameters may be stored in non-volatile memory modules 110 of the memory chips 100. Alternatively, after a memory wafer is cut to obtain discrete memory chips 100, process corners are detected and characterization parameters are stored in non-volatile memory modules 110 of the memory chips 100.

In some embodiments, the data has a readout path, the readout path includes stages through which the data is read out from the memory cell 10 and output through the data port DQ, and the data transmitted on the readout path is defined as intermediate data; and the memory chip 100 includes: a delay module 101, where the delay module 101 is provided on the readout path, an input terminal of the delay module 101 receives the intermediate data, a control terminal of the delay module 101 receives the reference voltage Vref, an output terminal of the delay module 101 outputs the intermediate data based on the reference voltage Vref, and a length of the delay of the delay module 101 from receiving the intermediate data to outputting the intermediate data corresponds to the value of the reference voltage Vref; and an adjustment module 102, where an output terminal of the adjustment module 102 is connected to the control terminal of the delay module 101, an input terminal of the adjustment module 102 receives a preset reference voltage VR, a control terminal of the adjustment module 102 receives a control signal Con, and the output terminal of the adjustment module 102 outputs, based on the control signal Con and the preset reference voltage VR, the reference voltage Vref with the adjustable value.

The data delay can be controlled, through the delay module 101, on any transmission path on the readout path of the data, such that the design of the memory chip 100 is more flexible; and the reference voltage Vref with the adjustable value can be output through the adjustment module 102 based on the preset reference voltage VR and the control signal Con, where the preset reference voltage VR may be a preset reference voltage specified in an operation manual of the memory chip 100, that is, the preset reference voltage may be a voltage value designed for the memory chip 100 under an ideal condition.

Specifically, there may be a drive module, a buffer module, a latch module, and the like on the readout path of the data, and the delay module 101 may be provided at any position of the readout path, for example, may be provided at a previous stage or a next stage of the drive module, may be provided at a previous stage or a next stage of the buffer module, may be provided at a previous stage or a next stage of the latch module, or may be provided inside the drive module, the buffer module, or the latch module. The control signal Con may be given by a controller of the memory system, and the control signal Con is further based on the process corner of the memory chip 100.

Figure 4:
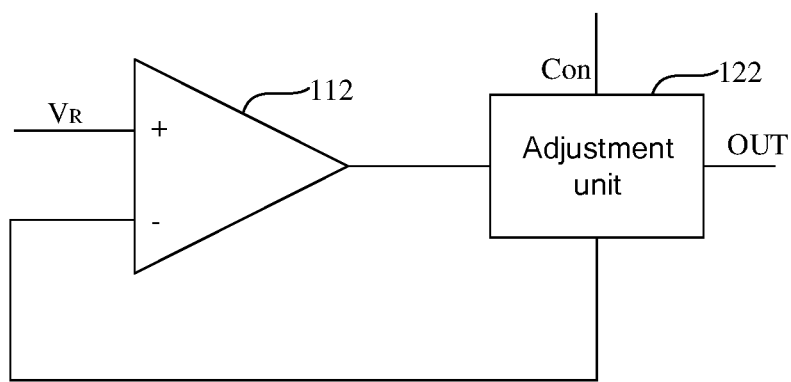
FIG. 4 is a schematic structural diagram of an adjustment module in a memory chip according to an embodiment of the present disclosure.

FIG. 4 is a schematic structural diagram of an adjustment module in a memory chip according to an embodiment of the present disclosure. Referring to FIG. 4, in some embodiments, the adjustment module 102 may include an operational amplifier 112, where a positive input terminal of the operational amplifier 112 receives the preset reference voltage VR; and an adjustment unit 122, where the adjustment unit 122 is connected to a negative input terminal and an output terminal of the operational amplifier 112, and an output terminal OUT of the adjustment unit 122 outputs the reference voltage Vref, and further adjusts, based on the control signal, a value of an equivalent resistance between the output terminal OUT of the adjustment unit 122 and the output terminal of the operational amplifier 112, or a value of an equivalent resistance between the output terminal of the adjustment unit 122 and a ground terminal.

According to the "virtual short" principle of the operational amplifier, a voltage of the negative input terminal of the operational amplifier 112 is the same as a voltage of the positive input terminal. The reference voltage $V_{ref}$ with the adjustable value is obtained through a structure of the operational amplifier 112 and the adjustment unit 122, such that a circuit structure of the adjustment module 102 is simple, and an area of the memory chip 100 occupied by the adjustment module 102 is small, which is beneficial to reducing a chip area of the memory chip 100. Specifically, the equivalent resistance between the output terminal OUT of the adjustment unit 122 and the ground terminal is defined to be R1, and the equivalent resistance between the negative input terminal of the operational amplifier 112 and the ground terminal is defined to be R2. In this case, the reference voltage $V_{ref}$ and the preset reference voltage $V_R$ meet the following relationship:

$$V_{ref}=(V_R/R2)*R1 \qquad (1)$$

The value of the reference voltage $V_{ref}$ can be adjusted by adjusting at least one of R1 or R2. Therefore, a value of R1 can be selected to be adjusted, and a value of R2 can be selected to be adjusted, or values of R1 and R2 are simultaneously adjusted, to adjust the value of the reference voltage $V_{ref}$.

Figure 5:
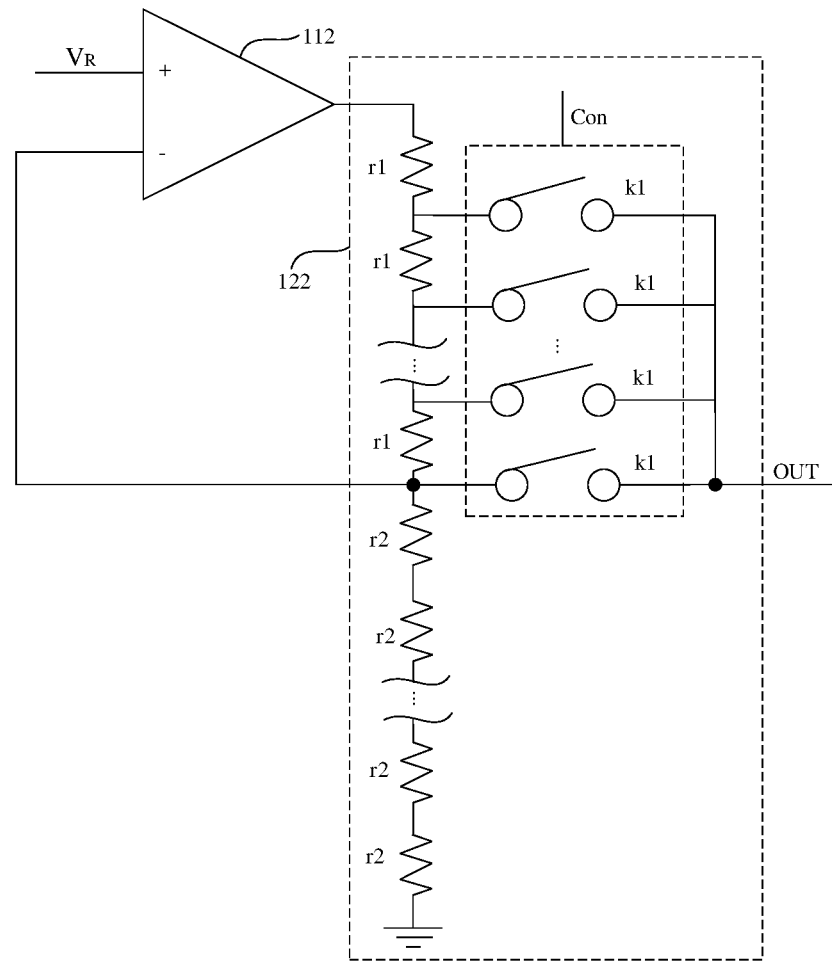
FIG. 5 is a schematic diagram of a circuit structure of an adjustment module in a memory chip according to an embodiment of the present disclosure.

Referring to FIG. 5, FIG. 5 is a schematic diagram of a circuit structure of an adjustment module. The adjustment unit 122 may include N first resistors r1 connected in series between the negative input terminal and the output terminal of the operational amplifier 112, where N is an integer greater than 1, and at least one second resistor r2, where the at least one second resistor r2 is connected between the negative input terminal and the ground terminal; and M first switches k1, where each of the first switches k1 connects the output terminal OUT of the adjustment unit 122 to a terminal of a respective first resistor r1, and the first switches k1 are selectively turned on (closed) based on the control signal Con, to adjust the value of the equivalent resistance between the output terminal of the adjustment unit 122 and the output terminal of the operational amplifier 112, where M is a positive integer less than or equal to N. N may be any natural number greater than 1 such as 2, 3, or 4, and M may be any natural number such as 1, 2, or 3.

Each of the first switches k1 may be a MOS transistor or a transmission gate. It should be noted that resistances of the first resistors r1 may be the same or different; and resistances of the at least one second resistor r2 may be the same or different. The value of the equivalent resistance between the output terminal OUT of the adjustment unit 122 and the output terminal of the operational amplifier 112 varies according to different turned-on conditions of the first switches k1.

Referring to FIG. 5, according to the "virtual short" principle of the operational amplifier, the voltage of the negative input terminal of the operational amplifier 112 is the same as the voltage of the positive input terminal, that is, the voltage of the negative input terminal is VR. Based on the voltage of the negative input terminal and a resistance of the negative input terminal to the ground terminal, a current from the negative input terminal to the ground terminal may be obtained. This current is also a current on a path from the output terminal of the operational amplifier 112 to the ground terminal. Only one of the plurality of first switches k1 is turned on (closed). Based on different turned-on conditions of the first switches k1, with reference to the current and the equivalent resistance between the output terminal OUT of the adjustment unit 122 and the ground terminal, the reference voltage Vref output by the output terminal OUT of the adjustment unit 122 may be calculated. If the first switch k1 connected to a node connecting the first resistor r1 and the second resistor r2 is turned on (closed), the reference voltage Vref output by the output terminal OUT of the adjustment unit 122 is the same as the preset reference voltage VR.

Figure 6:
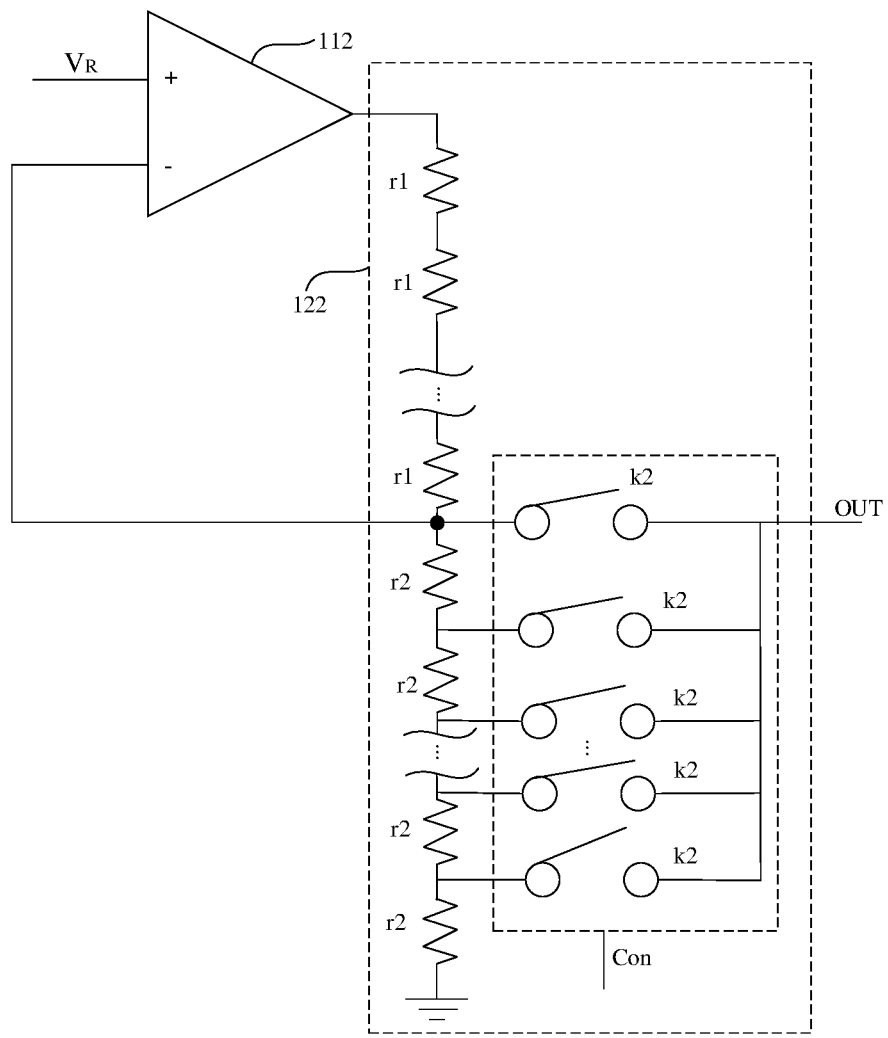
FIG. 6 is a schematic diagram of another circuit structure of an adjustment module in a memory chip according to an embodiment of the present disclosure.

In addition, the larger the numbers of the first resistors r1 and the first switches k1, the more possible values of the reference voltage Vref output by the adjustment module 102, the more possible values of an adjusted value of the data transmission delay, and the more beneficial to obtaining, through adjustment, a data delay matching a requirement. In a specific actual circuit, the area of the memory chip 100 occupied by the adjustment module 102 should also be considered. If the numbers of the first resistors r1 and the first switches k1 are excessively large, the area of the memory chip 100 is increased accordingly. For this, the numbers of the first resistors r1 and the first switches k1 may be properly selected based on the foregoing two requirements. Referring to FIG. 6, FIG. 6 is a schematic diagram of another circuit structure of an adjustment module. The adjustment unit 122 includes: X second resistors r2 connected in series between the negative input terminal and the ground terminal, where X is a positive integer greater than 1; and Y second switches k2, where each of the second switches k2 connects the output terminal OUT of the adjustment unit 122 to a terminal of a respective second resistor r2, and the second switches k2 are selectively turned on (closed) based on the control signal Con, to adjust the value of the equivalent resistance between the output terminal OUT of the adjustment unit 122 and the ground terminal, where Y is a positive integer less than or equal to X. X may be any natural number greater than 1 such as 2, 3, or 4, greater than 1, and Y may be any natural number such as 1, 2, or 3.

Each of the second switches k2 may be a MOS transistor or a transmission gate. It should be noted that resistances of the second resistors r2 may be the same or different. The value of the equivalent resistance between the output terminal OUT of the adjustment unit 122 and the ground terminal varies according to different turned-on conditions of the second switches k2.

In addition, the larger the numbers of the second resistors r2 and the second switches k2, the more possible values of the reference voltage Vref output by the adjustment module 102, the more possible values of an adjusted value of the data transmission delay, and the more beneficial to obtaining, through adjustment, a data delay matching a requirement. In a specific actual circuit, the area of the memory chip 100 occupied by the adjustment module 102 should also be considered. If the numbers of the second resistors r2 and the second switches k2 are excessively large, the area of the memory chip 100 is increased accordingly. For this, the numbers of the second resistors r2 and the second switches k2 may be properly selected based on the foregoing two requirements.

Referring to FIG. 6, in some embodiments, the adjustment unit 122 may further include at least one first resistor r1, the first resistor r1 is connected between the negative input terminal and the output terminal of the operational amplifier 112, and for a case in which there are a plurality of first resistors r1, the plurality of first resistors r1 are connected in series.

Referring to FIG. 6, according to the "virtual short" principle of the operational amplifier, the voltage of the negative input terminal of the operational amplifier 112 is the same as the voltage of the positive input terminal. For a calculation manner of the output terminal OUT of the adjustment unit 122, refer to the foregoing related description.

Figure 7:
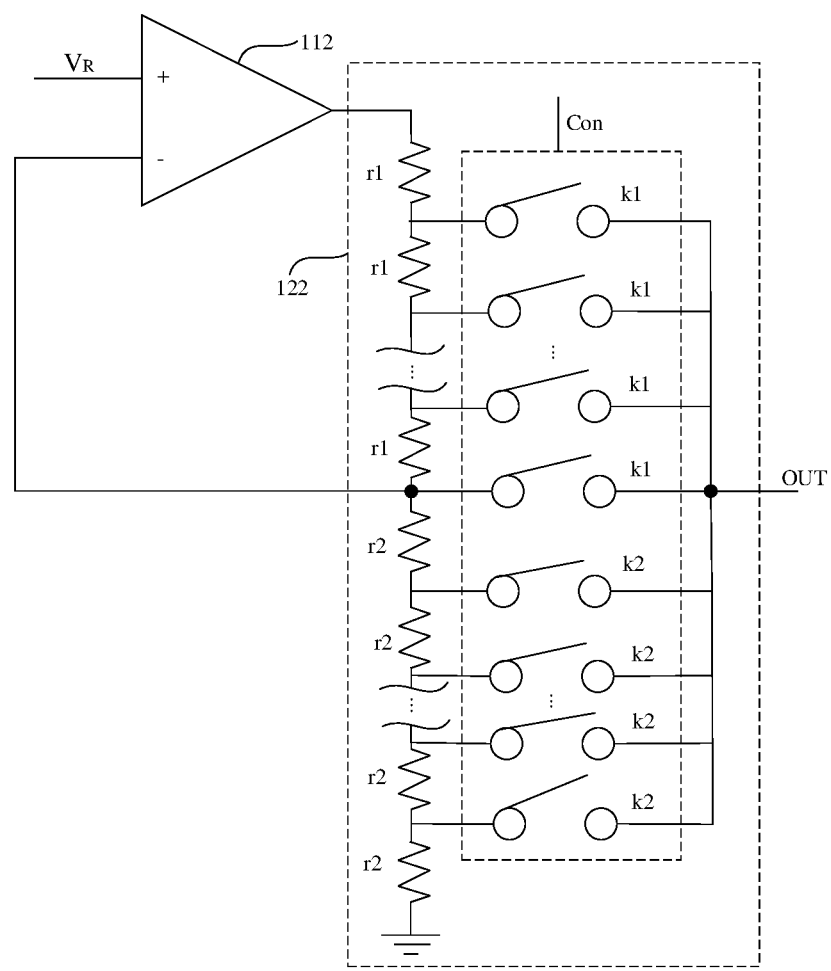
FIG. 7 is a schematic diagram of still another circuit structure of an adjustment module in a memory chip according to an embodiment of the present disclosure.

Referring to FIG. 7, FIG. 7 is another schematic structural diagram of an adjustment module. In some embodiments, the adjustment unit 122 may include: N first resistors r1 connected in series between the negative input terminal and the output terminal of the operational amplifier 112, where N is an integer greater than 1; M first switches k1, where each of the first switches k1 connects the output terminal OUT of the adjustment unit 122 to a terminal of a respective first resistor r1, and the first switches k1 are selectively turned on (closed) based on the control signal Con, to adjust the value of the equivalent resistance between the output terminal OUT of the adjustment unit 122 and the output terminal of the operational amplifier 112, where M is a positive integer less than or equal to N; X second resistors r2 connected in series between the negative input terminal and the ground terminal, where X is a positive integer greater than 1; and Y second switches k2, where each of the second switches k2 connects the output terminal OUT of the adjustment unit 122 to a terminal of a respective second resistor r2, and the second switches k2 are selectively turned on (closed) based on the control signal Con, to adjust the value of the equivalent resistance between the output terminal OUT of the adjustment unit 122 and the ground terminal, where Y is a positive integer less than or equal to X.

For a calculation manner of the voltage of the output terminal OUT of the adjustment unit 122, it is advised to refer to the foregoing related descriptions of FIG. 5 and FIG. 6.

Specifically, through the first switches k1 and the second switches k2, not only can the value of the equivalent resistance between the output terminal OUT of the adjustment unit 122 and the output terminal of the operational amplifier 112 be adjusted, but also the value of the equivalent resistance between the output terminal OUT of the adjustment unit 122 and the ground terminal can be adjusted. This is beneficial to adjusting the value of the reference voltage Vref more flexibly, and there are more options of adjusting the reference voltage Vref.

Figure 8:
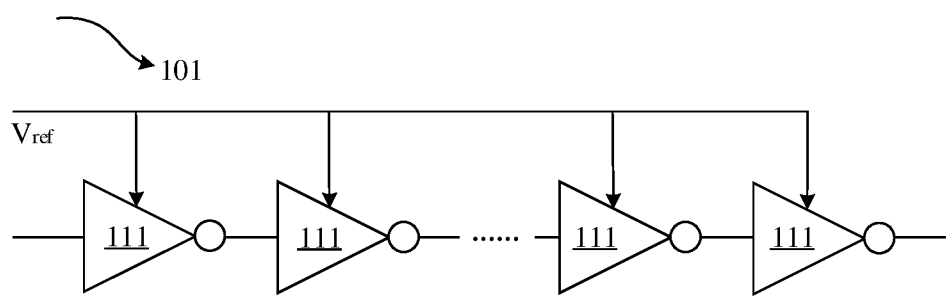
FIG. 8 is a schematic diagram of a circuit structure of a delay module in a memory chip according to an embodiment of the present disclosure.

Referring to FIG. 8, FIG. 8 is a schematic diagram of a circuit structure of a delay module. The delay module 101 includes an even number of inverters 111 connected in series, where a power supply terminal of each inverter 111 is connected to the reference voltage Vref, an input terminal of the inverter 111 at the first position receives the intermediate data, and an output terminal of the inverter 111 at the tail position outputs the intermediate data.

Compared with receiving the intermediate data by the output terminal of the first (that is, at the first position) inverter 111, outputting the intermediate data by the last (that is, at the tail position) inverter 111 has a delay, and a length of the delay is related to a delay time of each inverter 111. A length of the delay time of the inverter 111 may be adjusted by using the value of the reference voltage $V_{ref}$, to finally adjust the delay of transmitting the intermediate data by the delay module 101, thereby achieving the purpose of changing the length of the delay from reading out the data from the memory cell to outputting the data through the data port DQ. It should be noted that, in some embodiments, sizes of the inverters 111 may be the same, and delay characteristics of the inverters 111 may be the same; and in other embodiments, sizes of the inverters 111 may alternatively be different, and the inverters 111 have different delay characteristics.

Using the even number of inverters 111 connected in series to form the delay module 101 can not only realize a function of delaying the transmission of the intermediate data, but also enable the delay module 101 to have a simple circuit structure and occupy a small space of a chip area of the memory chip 100. This is beneficial to reducing the design difficulty of the memory chip 100 and reducing the chip area.

It may be understood that, in another embodiment, another proper delay circuit may alternatively be used as the delay module.

In some embodiments, referring to FIG. 3, the memory chip 100 may further include a scan chain interface 103, where the scan chain interface 103 is configured to: obtain the characterization parameter based on a command signal sent by a controller, and output the characterization parameter to the controller.

Specifically, the scan chain interface 103 may be used as a medium for transmitting a signal between the controller and the non-volatile memory module 110, and the characterization parameter is transmitted to the controller through the scan chain interface 103.

In the technical solution of the memory chip 100 provided in the foregoing embodiment, the delay from reading out the data from the memory cell to transmitting the data to the data port may be adjusted according to the value of the reference voltage, and the value of the reference voltage may be adjusted based on the process corner. In this way, the impact of different process corners on the data transmission delay can be resolved, to ensure that the data transmission delay meets an expectation, thereby preventing a problem of a data signal conflict from occurring.

For example, if the characterization parameter characterizes that the process corner is a fast process corner, a reference voltage of a corresponding memory chip 100 is reduced, such that a speed at which the data is read out from the memory cell and output through the data port is slower, and the delay from reading out the data from the memory cell to outputting the data through the data port is increased; if the characterization parameter characterizes that the process corner is a slow process corner, a reference voltage of a corresponding memory chip 100 is increased, such that a speed at which the data is read out from the memory cell and output through the data port is faster, and the delay from reading out the data from the memory cell to outputting the data through the data port is increased.

Correspondingly, an embodiment of the present disclosure further provides a memory system, where the memory system includes the memory chip provided in any one of the foregoing embodiments. The memory system provided in this embodiment of the present disclosure is described in detail below with reference to the accompanying drawings. It should be noted that, for the parts the same as or corresponding to those mentioned in the foregoing embodiments, reference may be made to the detailed descriptions of the foregoing embodiments. Details are not repeated below.

Figure 9:
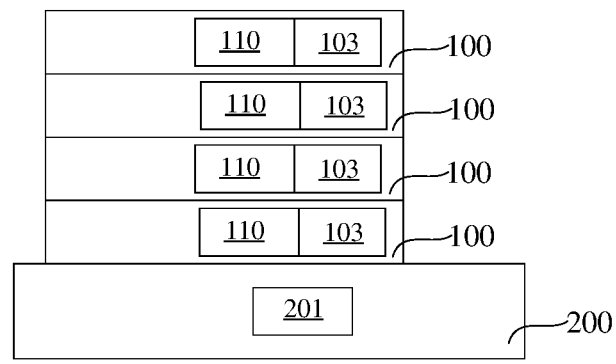
FIG. 9 is a schematic structural diagram of a memory system according to an embodiment of the present disclosure.

FIG. 9 is a schematic structural diagram of a memory system according to an embodiment of the present disclosure.

Referring to FIG. 3 and FIG. 9, the memory system includes: a plurality of memory chips 100 each provided in any one of the foregoing embodiments, and each of the plurality of memory chips 100 is configured such that each of the plurality of memory chips 100 stores a characterization parameter for characterizing a process corner of the corresponding memory chip 100, each of the plurality of memory chips 100 further has a reference voltage Vref with an adjustable value, the value of the reference voltage Vref is adjustable based on the characterization parameter, and each of the plurality of memory chips 100 adjusts, based on the reference voltage Vref, a delay from reading out data from a memory cell 10 to outputting the data through a data port DQ; and a controller 200, where the controller 200 is configured to: obtain the characterization parameters of the plurality of memory chips 100, and adjust, based on the characterization parameters, the values of the reference voltages Vref of the memory chips 100 corresponding to the characterization parameters.

The memory system includes the plurality of memory chips 100. Even if a delay from reading out data from a memory cell to outputting the data through a data port DQ is pre-designed for each of different memory chips 100 of the memory system, since the memory chips 100 still have a problem of different process corners, there is still a problem that a data readout delay deviates from that in the pre-design. However, in this embodiment of the present disclosure, the controller 200 further obtains a process corner of each memory chip 100, and adjusts a reference voltage Vref of the memory chip 100 according to a characterization parameter corresponding to the process corner, that is, the reference voltage Vref is compensated according to the process corner to adjust a delay of the memory chip 100 from reading out data from a memory cell to outputting the data through a data port DQ, such that an actually showed data readout delay conforms to that in the pre-design, thereby preventing a problem of a conflict between data transmission corresponding to the different memory chips 100 from occurring, and improving storage performance of the memory system.

Figure 10:
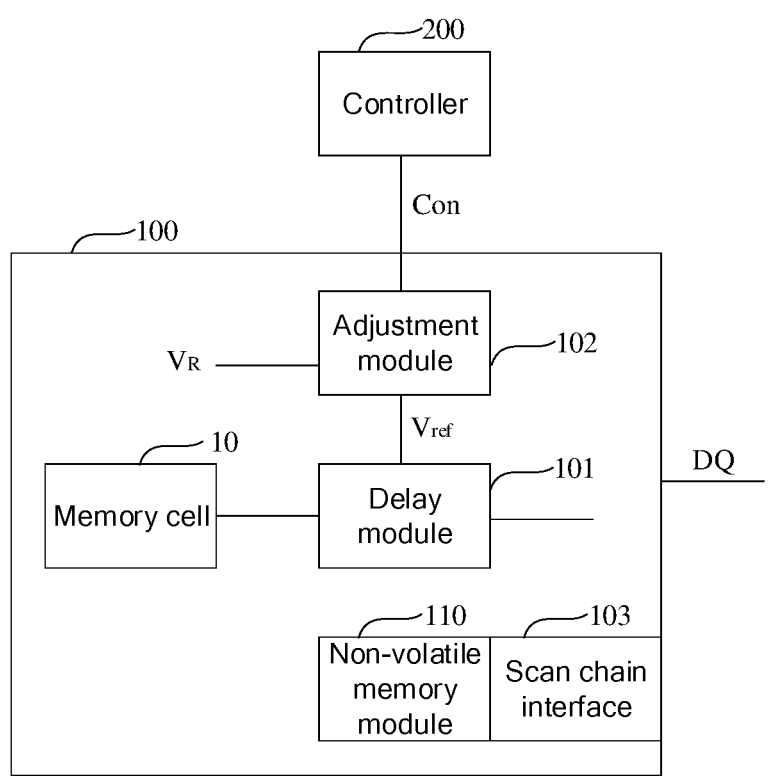
FIG. 10 is a schematic diagram of a functional module that is of a memory chip and a controller that are of a memory system according to an embodiment of the present disclosure.

FIG. 10 is a schematic diagram of a functional module of a memory chip and a controller. Referring to FIG. 10, in some embodiments, the data has a readout path, the readout path includes stages through which the data is read out from the memory cell 10 and output through the data port DQ, and the data transmitted on the readout path is defined as intermediate data; and the memory chip 100 includes: a delay module 101, where the delay module 101 is provided on the readout path, an input terminal of the delay module 101 receives the intermediate data, a control terminal of the delay module 101 receives the reference voltage Vref, an output terminal of the delay module 101 outputs the intermediate data based on the reference voltage Vref, and a length of the delay of the delay module 101 from receiving the intermediate data to outputting the intermediate data corresponds to the value of the reference voltage Vref; and an adjustment module 102, where an output terminal of the adjustment module 102 is connected to the control terminal of the delay module 101, an input terminal of the adjustment module 102 receives a preset reference voltage VR, a control terminal of the adjustment module 102 receives a control signal Con, and the output terminal of the adjustment module 102 outputs, based on the control signal Con and the preset reference voltage VR, the reference voltage Vref with the adjustable value, where the controller 200 is connected to the control terminal of the adjustment module 102, and the controller 200 is configured to: obtain the characterization parameter and generate the control signal Con based on the characterization parameter.

For the delay module 101, refer to the corresponding detailed descriptions of the foregoing embodiments. Details are not repeated herein.

Specifically, different control signals Con correspond to different characterization parameters, and different control signals correspond to reference voltages $V_{ref}$ with different values. The controller 200 generates a corresponding control signal Con based on a characterization parameter, such that the memory chip 100 obtains a reference voltage $V_{ref}$ corresponding to the characterization parameter.

Figure 11:
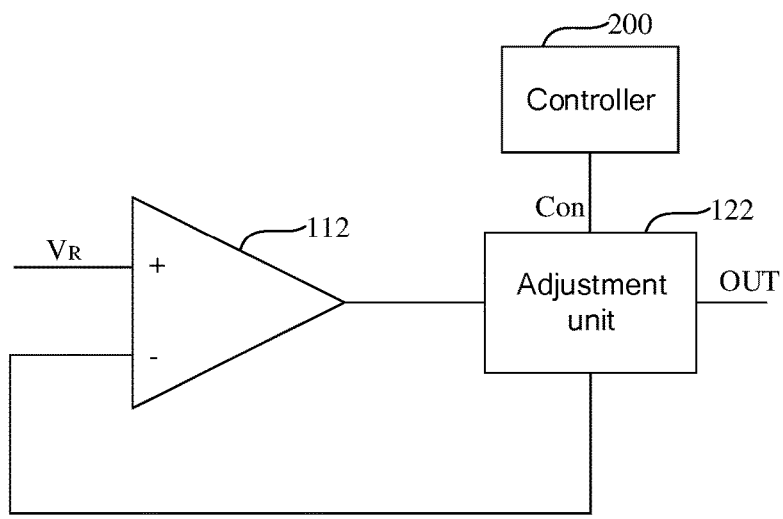
FIG. 11 is a schematic structural diagram of an adjustment module and a controller that are of a memory system according to an embodiment of the present disclosure.

As shown in FIG. 11, FIG. 11 is a schematic structural diagram of an adjustment module and a controller. In some embodiments, the adjustment module 102 may include an operational amplifier 112, where a positive input terminal of the operational amplifier 112 receives the preset reference voltage VR; and an adjustment unit 122, where the adjustment unit 122 is connected to a negative input terminal and an output terminal of the operational amplifier 112, and an output terminal OUT of the adjustment unit 122 outputs the reference voltage Vref, and further adjusts, based on the control signal Con, a value of an equivalent resistance between the output terminal OUT of the adjustment unit 122 and the output terminal of the operational amplifier 112, or a value of an equivalent resistance between the output terminal OUT of the adjustment unit 122 and a ground terminal, where the controller 200 is connected to the adjustment unit 122 and provides the control signal to the adjustment unit 122.

Specifically, the value of the equivalent resistance between the output terminal OUT of the adjustment unit 122 and the output terminal of the operational amplifier 112, and/or the value of the equivalent resistance between the output terminal OUT of the adjustment unit 122 and the ground terminal are determined by the control signal Con sent by the controller 200.

As shown in FIG. 5, in some embodiments, the adjustment unit 122 may include N first resistors r1 connected in series between the negative input terminal and the output terminal of the operational amplifier 112, where N is an integer greater than 1, and at least one second resistor r2, where the at least one second resistor r2 is connected between the negative input terminal and the ground terminal; and M first switches k1, where each first switch k1 connects the output terminal OUT of the adjustment unit 122 to a terminal of a respective first resistor r1, and the first switches k1 are selectively turned on (closed) based on the control signal Con, to adjust the value of the equivalent resistance between the output terminal OUT of the adjustment unit 122 and the output terminal of the operational amplifier 112, where M is a positive integer less than or equal to N, where the controller 200 is connected to the M first switches k1.

In addition, the first switches k1 are further connected between the negative input terminal of the operational amplifier 112 and the output terminal OUT of the adjustment unit 122. The first switches k1 are selectively turned on (closed) according to the control signal Con, that is, the controller 200 sends a corresponding independent control signal Con to each first switch k1 to select a first switch k1 to be turned on (closed), thereby adjusting the value of the equivalent resistance between the output terminal OUT of the adjustment unit 122 and the output terminal of the operational amplifier 112, and further adjusting the value of the reference voltage Vref.

Referring to FIG. 6, in some embodiments, the adjustment unit 122 further includes: X second resistors r2 connected in series between the negative input terminal of the operational amplifier 112 and the ground terminal, where X is a positive integer greater than 1; and Y second switches k2, where each of the second switches k2 connects the output terminal OUT of the adjustment unit 122 to a terminal of a respective second resistor r2, and the second switches k2 are selectively turned on (closed) based on the control signal Con, to adjust the value of the equivalent resistance between the output terminal OUT of the adjustment unit 122 and the ground terminal, where Y is a positive integer less than or equal to X, where the controller 200 is connected to the Y second switches k2.

Each of the second switches k2 is selectively turned on (closed) according to the control signal Con, that is, the controller 200 sends a corresponding independent control signal Con to each second switch k2 to select a second switch k2 to be turned on (closed), thereby adjusting the value of the equivalent resistance between the output terminal OUT of the adjustment unit 122 and the ground terminal, and further adjusting the value of the reference voltage Vref.

It may be understood that, in some embodiments, as shown in FIG. 7, the adjustment unit 122 may include only one type of the first switches k1 or the second switches k2, and in other embodiments, the adjustment unit 122 may alternatively include both the first switches k1 and the second switches k2.

It should be additionally noted that, as shown in the foregoing embodiments, regarding the design of the adjustment unit 122, only the value of the equivalent resistance between the output terminal OUT of the adjustment unit 122 and the output terminal of the operational amplifier 112 may be adjusted, only the value of the equivalent resistance between the output terminal OUT of the adjustment unit 122 and the ground terminal may be adjusted, or both the value of the equivalent resistance between the output terminal OUT of the adjustment unit 122 and the output terminal of the operational amplifier 112 and the value of the equivalent resistance between the output terminal OUT of the adjustment unit 122 and the ground terminal are adjusted. For specific circuit implementation, it is advised to refer to the descriptions of the foregoing embodiments. Details are not repeated herein.

In some embodiments, referring to FIG. 9, the memory chip 100 may include a non-volatile memory module 110; and the memory chip 100 is configured to: before being encapsulated with the controller 200, obtain the characterization parameter and store the characterization parameter into the non-volatile memory module 110.

In some embodiments, referring to FIG. 9, the memory chip 100 may further include a scan chain interface 103, where the scan chain interface 103 is configured to: obtain the characterization parameter based on a command signal sent by the controller 200, and output the characterization parameter to the controller 200; and the controller 200 further includes a parameter obtaining module 201, where the parameter obtaining module 201 is configured to: send the command signal to the scan chain interface 103, and receive the characterization parameter output through the scan chain interface 103.

Specifically, the parameter obtaining module 201 sends the command signal to the scan chain interface 103, the scan chain interface 103 obtains the characterization parameter stored in the non-volatile memory module 110 after receiving the command signal, and then the characterization parameter is transmitted to the parameter obtaining module 201 through the scan chain interface 103, and the controller 200 generates a corresponding control signal Con after obtaining the characterization parameter.

In some embodiments, the controller 200 is configured to: if the characterization parameter characterizes a fast process corner, generate the control signal Con used to control the reference voltage $V_{ref}$ to be less than a standard reference voltage, or if the characterization parameter characterizes a slow process corner, generate the control signal Con used to control the reference voltage $V_{ref}$ to be greater than a standard reference voltage.

The standard reference voltage may be a pre-designed ideal reference voltage of the memory chip 100. In an ideal case, a delay of the memory chip 100 from reading data from a memory cell to transmitting the data to a data port under the standard reference voltage meets an expectation. If the characterization parameter characterizes a fast process corner, the control signal generated by the controller 200 can make the value of the reference voltage $V_{ref}$ smaller than the standard reference voltage, that is, the reference voltage $V_{ref}$ of the memory chip 100 with the fast process corner is compensated. In this case, the delay from reading out the data from the memory cell to transmitting the data to the data port is longer than that before the compensation. In this way, a problem of a fast transmission speed caused by the fast process corner can be compensated for, such that the delay from reading out the data from the memory cell to transmitting the data to the data port meets the expectation better, that is, the delay after the compensation tends to be consistent with the delay under the ideal case (that is, pre-designed). If the characterization parameter characterizes a slow process corner, the control signal generated by the controller 200 can make the value of the reference voltage $V_{ref}$ greater than the standard reference voltage, that is, the reference voltage $V_{ref}$ of the memory chip 100 with the slow process corner is compensated. In this case, the delay from reading out the data from the memory cell to transmitting the data to the data port is shorter than that before the compensation. In this way, a problem of a slow transmission speed caused by the slow process corner can be compensated for, such that the delay from reading out the data from the memory cell to transmitting the data to the data port meets the expectation better, that is, the delay after the compensation tends to be consistent with the delay under the ideal case. In this way, timing sequences of data signals output from data ports in different memory chips 100 do not conflict. This is beneficial to improving performance of the memory system.

In addition, in some embodiments, if the characterization parameter characterizes a standard process corner, the reference voltage $V_{ref}$ of the corresponding memory chip 100 may be the same as the standard reference voltage.

In some embodiments, the controller 200 is configured to: each time after the memory system is started, obtain the characterization parameter of each memory chip 100, and adjust the value of the reference voltage Vref of each memory chip 100 based on its obtained characterization parameter, until characterization parameters of all of the memory chips 100 have been obtained through polling and values of reference voltages Vref of all of the memory chips 100 have been adjusted.

The working principle of the controller 200 is described in more detail below.

In an example, the controller 200 may adjust the reference voltage of the memory chip 100 in the following manner: performing a read and write operation test, obtaining a delay of each memory chip 100 from reading out data from a memory cell to transmitting the data to a data port, and obtaining a memory chip 100 whose delay does not meet an expectation; obtaining a characterization parameter of the memory chip 100 whose delay does not meet the expectation by using a memory chip 100 whose delay meets the expectation as a standard or by using a memory chip 100 with a standard process corner as a standard, and adjusting a reference voltage of the memory chip 100; and performing the read and write operation test on the adjusted memory chip 100 again, and if a data delay still does not meet a requirement, continuing to adjust the reference voltage of the memory chip 100 until data of the adjusted memory chip 100 meets the requirement.

Figure 12:
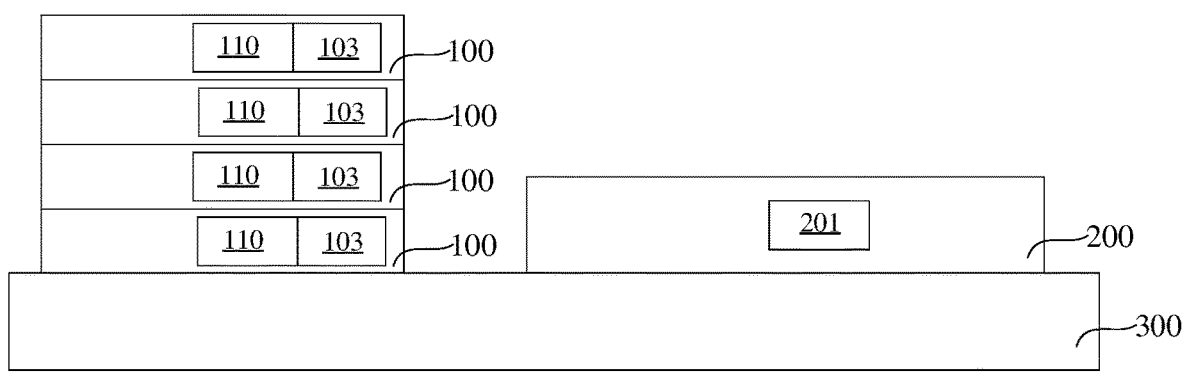
FIG. 12 is another schematic structural diagram of a memory system according to an embodiment of the present disclosure.

As shown in FIG. 9, in some embodiments, a plurality of memory chips 100 are sequentially stacked on a surface of the controller 200, and the memory system is a 3D stacked structure. FIG. 12 is another schematic structural diagram of a memory system according to an embodiment of the present disclosure. In other embodiments, as shown in FIG. 12, the memory system may further include: a carrier substrate 300, where the controller 200 is located on a surface of the carrier substrate 300, a plurality of memory chips 100 are sequentially stacked on the surface of the carrier substrate 300, and the memory system forms a 2.5D stacked structure.

The embodiments of the present disclosure provide a memory system with a superior structure and superior performance, where a reference voltage for controlling a data transmission speed can be adjusted according to a process corner of a memory chip 100, such that a data transmission delay of each memory chip 100 meets an expectation, thereby improving read and write performance of the memory system.

Those of ordinary skill in the art can understand that the foregoing implementations are specific embodiments for implementing the present disclosure. During actual application, various changes may be made to the foregoing embodiments in terms of form and details without departing from the spirit and scope of the present disclosure. Any person skilled in the art may make changes and modifications without departing from the spirit and scope of the present disclosure. Therefore, the protection scope of the present disclosure should be subject to the scope defined by the claims.

What is claimed is:

1. A memory chip, included in a memory system, comprising:
the memory chip storing a characterization parameter for characterizing a process corner of the memory chip, the memory chip further having a reference voltage with an adjustable value, the value of the reference voltage is adjustable based on the characterization parameter, and the memory chip adjusts, based on the reference voltage, a delay from reading out data from a memory cell to outputting the data through a data port.

2. The memory chip according to claim 1, wherein the data has a readout path, the readout path comprises stages for reading out the data from the memory cell and outputting the data through the data port, and the data transmitted on the readout path is defined as intermediate data; and the memory chip comprises:
- a delay module, wherein the delay module is provided on the readout path, an input terminal of the delay module receives the intermediate data, a control terminal of the delay module receives the reference voltage, an output terminal of the delay module outputs the intermediate data based on the reference voltage, and a length of the delay of the delay module from receiving the intermediate data to outputting the intermediate data corresponds to the value of the reference voltage; and
- an adjustment module, wherein an output terminal of the adjustment module is connected to the control terminal of the delay module, an input terminal of the adjustment module receives a preset reference voltage, a control terminal of the adjustment module receives a control signal, and the output terminal of the adjustment module outputs, based on the control signal and the preset reference voltage, the reference voltage with the adjustable value.

3. The memory chip according to claim 2, wherein the adjustment module comprises:
- an operational amplifier, wherein a positive input terminal of the operational amplifier receives the preset reference voltage; and
- an adjustment unit, wherein the adjustment unit is connected to a negative input terminal and an output terminal of the operational amplifier, and an output terminal of the adjustment unit outputs the reference voltage, and further adjusts, based on the control signal, a value of an equivalent resistance between the output terminal of the adjustment unit and the output terminal of the operational amplifier, or a value of an equivalent resistance between the output terminal of the adjustment unit and a ground terminal.

4. The memory chip according to claim 3, wherein the adjustment unit comprises:
- N first resistors connected in series between the negative input terminal and the output terminal of the operational amplifier, wherein N is an integer greater than 1, and at least one second resistor, wherein the at least one second resistor is connected between the negative input terminal and the ground terminal; and
- M first switches, wherein each of the first switches connects the output terminal of the adjustment unit to a terminal of a respective first resistor, and each of the first switches is selectively turned on based on the control signal, to adjust the value of the equivalent resistance between the output terminal of the adjustment unit and the output terminal of the operational amplifier, wherein M is a positive integer less than or equal to N.

5. The memory chip according to claim 3, wherein the adjustment unit comprises:
- X second resistors connected in series between the negative input terminal and the ground terminal, wherein X is a positive integer greater than 1; and
- Y second switches, wherein each of the second switches connects the output terminal of the adjustment unit to a terminal of a respective second resistor, and each of the second switches is selectively turned on based on the control signal, to adjust the value of the equivalent resistance between the output terminal of the adjustment unit and the ground terminal, wherein Y is a positive integer less than or equal to X.

6. The memory chip according to claim 2, wherein the delay module comprises:
- an even number of inverters connected in series, wherein a power supply terminal of each inverter is connected to the reference voltage, an input terminal of an inverter at a first position receives the intermediate data, and an output terminal of an inverter at a tail position outputs the intermediate data.

7. The memory chip according to claim 1, wherein the memory chip comprises a non-volatile memory module, wherein the non-volatile memory module is configured to store the characterization parameter.

8. The memory chip according to claim 7, wherein the non-volatile memory module comprises a one-time programmable memory cell.

9. The memory chip according to claim 1, wherein the memory chip further comprises a scan chain interface, wherein the scan chain interface is configured to: obtain the characterization parameter based on a command signal sent by a controller, and output the characterization parameter to the controller.

10. A memory system, comprising:
- a plurality of memory chips, each memory chip of the plurality of memory chips comprising:
- the memory chip storing a characterization parameter for characterizing a process corner of the memory chip, the memory chip further having a reference voltage with an adjustable value, the value of the reference voltage is adjustable based on the characterization parameter, and the memory chip adjusts, based on the reference voltage, a delay from reading out data from a memory cell to outputting the data through a data port; and
- the memory system further comprising a controller, wherein the controller is configured to: obtain the characterization parameters of the plurality of memory chips, and adjust, based on the characterization parameters, the values of the reference voltages of the memory chips corresponding to the characterization parameters.

11. The memory system according to claim 10, wherein the data has a readout path, the readout path comprises stages for reading out the data from the memory cell and outputting the data through the data port, and the data transmitted on the readout path is defined as intermediate data; and the memory chip comprises:
- a delay module, wherein the delay module is provided on the readout path, an input terminal of the delay module receives the intermediate data, a control terminal of the delay module receives the reference voltage, an output terminal of the delay module outputs the intermediate data based on the reference voltage, and a length of the delay of the delay module from receiving the intermediate data to outputting the intermediate data corresponds to the value of the reference voltage; and
- an adjustment module, wherein an output terminal of the adjustment module is connected to the control terminal of the delay module, an input terminal of the adjustment module receives a preset reference voltage, a control terminal of the adjustment module receives a control signal, and the output terminal of the adjustment module outputs, based on the control signal and the preset reference voltage, the reference voltage with the adjustable value, wherein
- the controller is connected to the control terminal of the adjustment module, and the controller is configured to: obtain the characterization parameter and generate the control signal based on the characterization parameter.

12. The memory system according to claim 11, wherein the adjustment module comprises:
- an operational amplifier, wherein a positive input terminal of the operational amplifier receives the preset reference voltage; and
- an adjustment unit, wherein the adjustment unit is connected to a negative input terminal and an output terminal of the operational amplifier, and an output terminal of the adjustment unit outputs the reference voltage, and further adjusts, based on the control signal, a value of an equivalent resistance between the output terminal of the adjustment unit and the output terminal of the operational amplifier, or a value of an equivalent resistance between the output terminal of the adjustment unit and a ground terminal, wherein
- the controller is connected to the adjustment unit, and provides the control signal to the adjustment unit.

13. The memory system according to claim 12, wherein the adjustment unit comprises:
- N first resistors connected in series between the negative input terminal and the output terminal of the operational amplifier, wherein N is an integer greater than 1, and at least one second resistor, wherein the at least one second resistor is connected between the negative input terminal and the ground terminal; and
- M first switches, wherein each of the first switches connects the output terminal of the adjustment unit to a terminal of a respective first resistor, and each of the first switches is selectively turned on based on the control signal, to adjust the value of the equivalent resistance between the output terminal of the adjustment unit and the output terminal of the operational amplifier, wherein M is a positive integer less than or equal to N, wherein
- the controller is connected to the M first switches.

14. The memory system according to claim 12, wherein the adjustment unit comprises:
- X second resistors connected in series between the negative input terminal and the ground terminal, wherein X is a positive integer greater than 1; and
- Y second switches, wherein each of the second switches connects the output terminal of the adjustment unit to a terminal of a respective second resistor, and each of the second switches is selectively turned on based on the control signal, to adjust the value of the equivalent resistance between the output terminal of the adjustment unit and the ground terminal, wherein Y is a positive integer less than or equal to X, wherein
- the controller is connected to the Y second switches.

15. The memory system according to claim 10, wherein the controller is configured to: if the characterization parameter characterizes a fast process corner, generate a control signal used to control the reference voltage to be less than a standard reference voltage, or if the characterization parameter characterizes a slow process corner, generate the control signal used to control the reference voltage to be greater than the standard reference voltage.

16. The memory system according to claim 10, wherein the memory chip further comprises a scan chain interface, wherein the scan chain interface is configured to:
- obtain the characterization parameter based on a command signal sent by the controller, and output the characterization parameter to the controller; and the controller further comprises:
- a parameter obtaining module, wherein the parameter obtaining module is configured to: send the command signal to the scan chain interface, and receive the characterization parameter output through the scan chain interface.

17. The memory system according to claim 10, wherein the memory chip comprises a non-volatile memory module; and the memory chip is configured to: before being encapsulated with the controller, obtain the characterization parameter and store the characterization parameter into the non-volatile memory module.

18. The memory system according to claim 17, wherein the controller is configured to: each time after the memory system is started, obtain the characterization parameter of each memory chip, and adjust the value of the reference voltage of each memory chip based on the obtained characterization parameter, until characterization parameters of all of the plurality of memory chips have been obtained through polling and values of reference voltages of all of the plurality of memory chips have been adjusted.

19. The memory system according to claim 10, wherein the plurality of the memory chips are sequentially stacked on a surface of the controller; or the memory system further comprises a carrier substrate, wherein the controller is located on a surface of the carrier substrate, and the plurality of memory chips are sequentially stacked on the surface of the carrier substrate.

* * * * *